United States Patent
De Ceuninck

(10) Patent No.: US 8,030,099 B2
(45) Date of Patent: Oct. 4, 2011

(54) METHOD FOR DETERMINING TIME TO FAILURE OF SUBMICRON METAL INTERCONNECTS

(75) Inventor: Ward De Ceuninck, Nerem (BE)

(73) Assignees: IMEC, Leuven (BE); Universiteit Hasselt, Diepenbeek (BE)

( * ) Notice: Subject to any disclaimer, the term of this patent is extended or adjusted under 35 U.S.C. 154(b) by 383 days.

(21) Appl. No.: 11/596,264

(22) PCT Filed: May 11, 2005

(86) PCT No.: PCT/BE2005/000076
§ 371 (c)(1),
(2), (4) Date: Dec. 6, 2007

(87) PCT Pub. No.: WO2005/109018
PCT Pub. Date: Nov. 17, 2005

(65) Prior Publication Data
US 2008/0098270 A1    Apr. 24, 2008

(30) Foreign Application Priority Data

May 11, 2004    (EP) .................................... 04447117

(51) Int. Cl.
*G01R 31/26*    (2006.01)
(52) U.S. Cl. .............. 438/17; 438/18; 438/663; 257/48; 257/E21.324; 257/E21.497; 257/E21.521; 257/E21.522
(58) Field of Classification Search .................... 438/14, 438/17, 18, FOR. 407; 257/48, E21.324, 257/E21.497, E21.521, E21.524
See application file for complete search history.

(56) References Cited

U.S. PATENT DOCUMENTS

| | | | |
|---|---|---|---|
| 5,264,377 A | | 11/1993 | Chesire et al. |
| 5,497,076 A | * | 3/1996 | Kuo et al. ................... 324/158.1 |
| 6,037,795 A | | 3/2000 | Filippi et al. |
| 6,163,288 A | | 12/2000 | Yoshizawa |
| 6,714,037 B1 | * | 3/2004 | Hau-Riege et al. ...... 324/750.03 |
| 6,770,847 B2 | * | 8/2004 | Yao et al. ....................... 219/209 |

(Continued)

FOREIGN PATENT DOCUMENTS

DE    40 03 682 A1    8/1991

(Continued)

OTHER PUBLICATIONS

Highly Accelerated Electromigration life time Test by Oliver Aubel, Wolfgang Hasse, and Martina Hommel, IEEE, vol. 3, Dec. 2003.*

(Continued)

*Primary Examiner* — Matthew Smith
*Assistant Examiner* — Su Kim
(74) *Attorney, Agent, or Firm* — McDonnell Boehnen Hulbert & Berghoff LLP

(57) ABSTRACT

The present disclosure is related to a method for determining time to failure characteristics of a microelectronics device. A test structure, being a parallel connection of a plurality of such on-chip interconnects, is provided. Measurements are performed on the test structure under test conditions for current density and temperature. The test structure is arranged such that failure of one of the on-chip interconnects within the parallel connection changes the test conditions for at least one of the other individual on-chip interconnects of the parallel connection. From these measurements, time to failure characteristics are determined, whereby the change in the test conditions is compensated for.

11 Claims, 5 Drawing Sheets

U.S. PATENT DOCUMENTS

| | | | |
|---|---|---|---|
| 6,822,473 B1 * | 11/2004 | Hau-Riege et al. | 324/762.1 |
| 2002/0017906 A1 | 2/2002 | Ho et al. | |
| 2003/0231123 A1 | 12/2003 | Knepper et al. | |
| 2004/0051553 A1 | 3/2004 | Manna et al. | |
| 2004/0220775 A1 * | 11/2004 | Schuh | 702/185 |
| 2004/0239544 A1 | 12/2004 | Li | |
| 2005/0030214 A1 | 2/2005 | Jo | |

FOREIGN PATENT DOCUMENTS

| | | |
|---|---|---|
| EP | 0395149 | 10/1990 |
| GB | 2176653 | 12/1986 |

OTHER PUBLICATIONS

Jochen Von Hagen and Harry A Schafft, Temperature Determination Methods on Copper Material for Highly Accelerated Electromigration Test (e.g. SWEAT), 2002, IEEE, 0-7803-7558-0/02/, 2002 IRW Final Report.*

Cher Ming Tan and Kelvin Ngan Chong Yeo, "a reliability statistics perspective on the pitfalls of standard wafer-level electromigratioin accelerated test" Juornal of electronic testing: theory and application 17, 63-68, 2001.*

Hin-Kion Yap, Kin-Leong Yap, Yew-Chee Tan and Keng-Foo Lo "wafer level electromigration Testing on Via/Line structure with a poly heated method in comparision to standard package level Tests", IEEE, Proceeding of 10 th IPFA 2003.*

International Search Report from International Application No. PCT/BE2005/000076, dated Sep. 14, 2005.

IEEE Transactions on Device and Materials Reliability, "Highly Accelerated Electromigration Lifetime Test (HALT) of Copper", Oliver Aubel, Wolfgang Hasse, and Martina Hommel, vol. 3, No. 4, Dec. 2003.

Clemens Lasance, Philips Research Laboratories, Electronics Cooling, "Thermal resistance: an oxymoran?", May 1997.

Infineon Technologies, XP-002303346, "Thermal Resistance calculation", Apr. 23, 2002.

Journal of Materials Research, XP-002303344, "Simulation of the temperature and current density scaling of the electromigration-limited reliability of near-bamboo interconnects", B.D. Knowlton and C.V. Thompson, vol. 13, No. 5, May 1998.

Partial European Search Report from Application No. EP 04 44 7117, dated Nov. 15, 2004.

* cited by examiner

METHOD FOR DETERMINING TIME TO FAILURE OF SUBMICRON METAL INTERCONNECTS

BACKGROUND

The present invention is related to a method for determining the lifetime characteristics of submicron metal interconnects.

In the microelectronics industry scaling refers to the miniaturisation of active components and connections on a chip. It has followed Moore's law for many decades. Despite many advantages, scaling also strongly influences the reliability and time to failure of interconnects, i.e. the (metal) conductor lines connecting elements of the integrated circuit. Electromigration (EM), i.e. the mass transport of a metal due to the momentum transfer between conducting electrons and diffusing metal ions, is one of the most severe failure mechanisms of on-chip interconnects. A major problem when testing the reliability of new components is that their time to failure under real life conditions ($T_{max}=125°$ C.; $j=1-3 \ 10^5$ A/cm$^2$ for a standard type IC) is always extremely long (in order of years). For that reason, the physical failure mechanisms are studied and methods are established for accelerating these mechanisms. The failure times of the devices in operation are measured and models are developed for extrapolating these results to real life conditions. The electromigration accelerating conditions for these tests are the temperature T and the current density j. Reliability tests are usually performed on identical interconnects at accelerating conditions (j,T) (170° C.$<$T$<$350° C. and $10^6<j<10^7$ A/cm$^2$ instead of T=125° C. and j=1-3.10$^5$ A/cm$^2$). All interconnects are each individually connected with an own power supply and provided with a multiplexer. Moreover, each interconnect can be found on a different IC package, which is an expensive and time-consuming activity. In order to derive the activation energy, which is a parameter describing the temperature dependence of the observed degradation, these tests must be performed at three temperatures, therefore tripling the number of power supplies, multiplexers and IC packages. This makes the tests more complex and expensive. Nevertheless these reliability tests are of great importance to manufacturers because on the one hand continuously operational IC's are indispensable and on the other hand the competitive strength of manufacturers strongly depends on the reliability of their products. Therefore such tests should provide a large amount of statistical information in a relatively short period of time, while keeping costs under control. It is hard to lower the costs without decreasing the accuracy of the experiments. To solve this problem one need to look for a test structure that can provide a large amount of accurate data in a short period of time at low cost.

Patent document US-2002/0017906-A1 discloses a method for detecting early failures in a large ensemble of semiconductor elements. It employs a parallel test structure. A Wheatstone bridge arrangement is used to measure small resistance changes. The criterion for failure of the test structure is the time to first discernible voltage imbalance $\Delta V(t)$.

SUMMARY

The present disclosure aims to provide a method for determining the time to failure that allows manufacturers to perform reliability tests in a relatively fast and inexpensive way.

The disclosure relates to a method for determining time to failure characteristics of an on-chip interconnect subject to electromigration. One such method includes the steps of providing a test structure, being a parallel connection of a plurality of such on-chip interconnects, performing measurements on the test structure under test conditions for current density and temperature, the test structure being such that failure of one of the on-chip interconnects within the parallel connection changes the test conditions for at least one of the other individual on-chip interconnects of the parallel connection, determining from the measurements estimates of the time to failure characteristics, whereby the change in the test conditions is compensated for.

Preferably the step of determining is based on fitting. Advantageously the current density exponent n and the activation energy $E_a$ are determined with the fitting.

The time to failure characteristics preferably include the median time to failure of the on-chip interconnects as well as the shape parameter.

In a preferred embodiment the method further comprises a step of correcting the shape parameter estimation, the shape parameter being determined by fitting. The step of correcting the shape parameter is advantageously performed via a predetermined relationship.

Preferably the parallel connection of the on-chip interconnects is within a single package.

In an alternative embodiment the method further comprises the step of performing measurements on the individual devices, belonging to the parallel connection. The step of compensating typically includes correcting the measurements on the individual interconnects.

The measurements advantageously are performed with electromigration accelerating test conditions for current density and temperature.

In an another advantageous embodiment the determining step includes the step of determining the time to failure characteristics under real life conditions by extrapolation. The extrapolation typically uses the Black model, which is used to describe the temperature and current dependency of the observed degradation.

The measurements are advantageously resistance change measurements.

In a specific embodiment the electromigration accelerating test conditions are used as input values.

Further the number of interconnects within parallel connection may be used as input value. Also the failure criterion can be used as input.

Preferably the measurements are performed at several time instances. Advantageously the measurements are performed at least three different temperatures.

In a preferred embodiment the on-chip interconnect is in a 90 nm technology. Alternatively it is in a sub 90 nm technology.

The invention also relates to a program, executable on a programmable device containing instructions, which when executed, perform the method as described before.

DETAILED DESCRIPTION

This specification discloses a method for determining time to failure characteristics of a metal interconnect using a test structure comprising a plurality of such interconnects. From a statistical point of view, a series connection of metal interconnects is the optimum configuration for the reliability tests, because the same current passes through all the series connected metal lines. However, a series test structure may be difficult to use in practice due to technical limitations of the measurement equipment.

Figure 1:
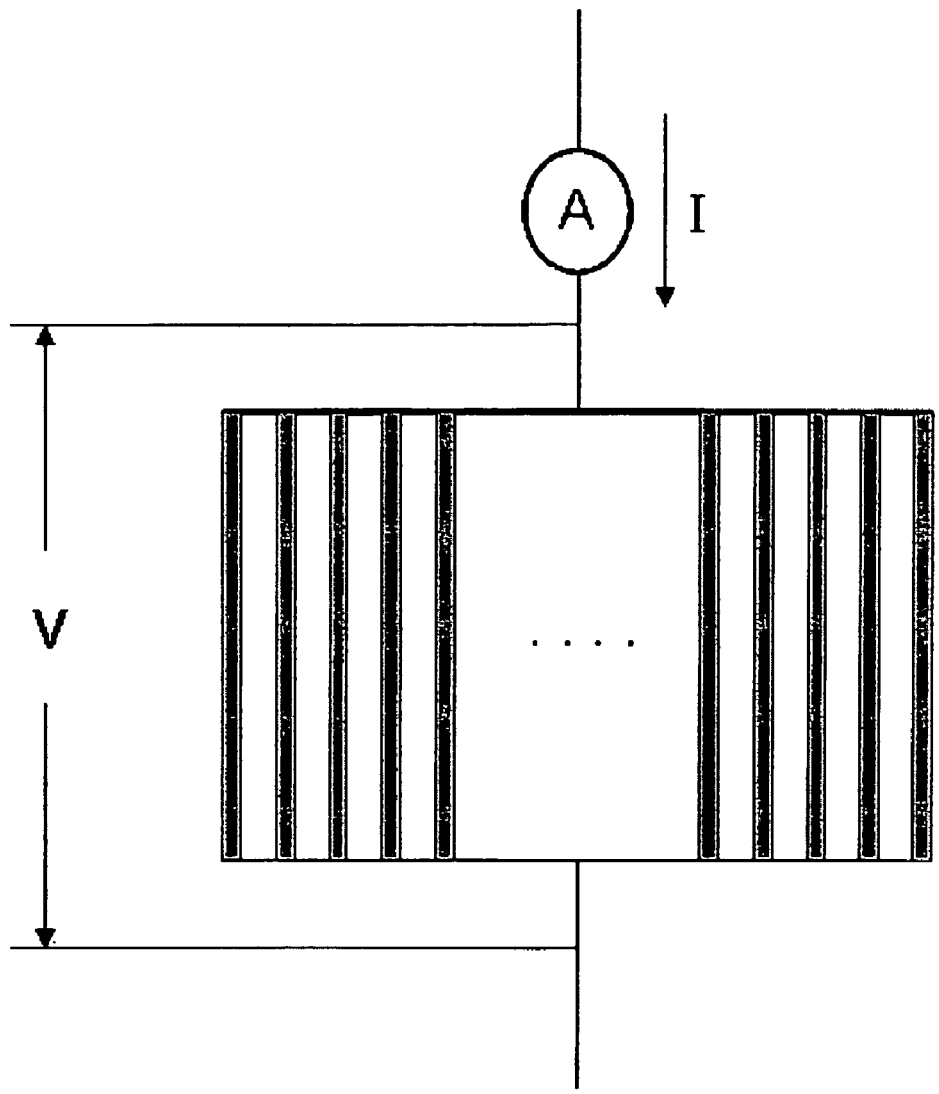
FIG. 1 is a schematic diagram of a parallel test structure as used in the method of the present invention.

Alternatively, a test structure with a parallel configuration is used (see FIG. 1). Such a structure yields much faster reliability data to the customer than conventional structures thanks to their inherently larger statistical information. Besides the obtained reduction in measurement time it will furthermore be possible for the customer to apply less accelerating test conditions (i.e. test conditions closer to real-life). This renders the extrapolation of test data to user conditions more straightforward and reliable. As an additional advantage, the approach described herein allows use of only one current source for the whole test structure instead of one current source per interconnect.

The method described herein is validated by mathematical simulation. In order to calculate and to compare the behaviour of parallel and/or series test structures, simulation experiments have been carried out and further analysed by means of both the total resistance (TR) analysis and a software package for reliability data analysis. The former method uses the resistance of the global structure (being series or parallel connected) and is therefore called total resistance method. The structure which is constituted of a set of individual interconnects is treated as one structure. The resistance behaviour of this global structure is monitored and the time at which the failure criterion is exceeded is determined as can be seen in Table I, TR analysis. The second method called 'reliability data analysis' makes use of the behaviour of each individual interconnect that is part of the global structure which can be a parallel or series connection of the individual interconnects. For each individual interconnect, the time to reach the failure criterion has been determined. A cumulative failure distribution can be derived using this information and by means of a commercially available software package the distribution parameters (μ and σ) can be determined. In practice, only the TR-analysis can be used for the series or parallel test structures.

The parameter studied during the accelerating conditions is the relative resistance change, defined as $$\frac{\Delta R(t)}{R_0} \equiv \frac{R(t) - R(t=0)}{R(t=0)} \quad \text{(equation 1)}$$

The resistance R(t) is the resistance of the interconnect at time t and at accelerating conditions j (current density) and T (temperature). It can be shown that $\Delta R(t)/R_0$ changes linearly as a function of time. FC is defined as the failure criterion of an interconnect. This means that interconnects with a drift $\Delta R(t)/R_0$ exceeding FC, are considered as failed. Subsequently, $$\frac{\Delta R(t)}{R_0} = \frac{FC}{t_F} t \quad \text{(equation 2)}$$

where $t_F$ is the failure time of the interconnect. The studied quantity is the median of the failure times, i.e. the time where 50% of the interconnects failed, according to the failure criterion.

For extrapolation of the simulation results to more real life conditions, the Black-model is used, which is the most intensively used extrapolation model. This model relates the median time to failure $MT_F$ of a set of interconnects with the temperature T (in K) and the current density j (in MA/cm$^2$).

$$MT_F = A j^{-n} \exp\left(\frac{E_a}{k_B T}\right) \quad \text{(equation 3)}$$

where A is a material constant, $k_B$ the Boltzmann constant, $E_a$ the activation energy (in eV) of the thermally driven process and n the current density exponent, which usually has a value between 1 and 3.

For a typical test a set of N interconnects is taken with accelerating conditions j and T. It is assumed that both j and T are constant and that the failure times of the interconnects obey to a monomodal distribution. Moreover, a lognormal distribution is taken, because it is the far most commonly used distribution, i.e. $t_f \propto$ log n(ν,σ). So, the natural logarithm of $t_f$, ln($t_f$), has a normal distribution. Moreover, its mean μ is given by the natural logarithm of the median time to failure. The median time to failure and σ are called the scale and shape parameter of the distributed failure times, respectively. Given the 1-to-1 relationship between the mean μ of a lognormal distribution and the median time to failure $MT_F$, further on the notation log n ($MT_F$, σ) is applied, which clearly is to be interpreted as log n (μ=ln($MT_F$), σ). Due to transformations of statistical distributions, the relative resistance ΔR is lognormally distributed, ΔR ∝ log n ($\Delta R_{med}'$,σ), with median $\Delta R_{med}'$ given by $$\Delta R'_{med} = \frac{R_0 FC}{MT_F} \quad \text{(equation 4)}$$

The shape parameter σ is the same as for the failure times. At higher accelerating conditions (different j or T), the resistance change per unit of time is also lognormally distributed. Using the Black equation (3), the scale parameter $\Delta R_{med}'$ (j,T) at higher accelerating conditions can be written as $$\Delta R'_{med}(j, T) = \Delta R'_{med}(j_1, T_1)\left(\frac{j_1}{j}\right)^n \exp\left[\frac{E_a}{k_B}\left(\frac{1}{T} - \frac{1}{T_1}\right)\right] \quad \text{(equation 5)}$$

where $\Delta R_{med}'$ ($j_1$,$T_1$) is the scale parameter of the lognormally distributed $\Delta R$ at accelerating conditions $j_1$ and $T_1$ and the shape parameter is the same for all accelerating conditions.

The simulation of a series electromigration test structure of N parallel interconnects is quite simple. For this structure, the current density j in equation (3) is assumed constant as a function of time and as a consequence, for each interconnection, the resistance change per unit of time $DR_i(t)=DR_i(1)$ is also constant as a function of time. Moreover, $DR_i(t) \propto \log n(\Delta R_{med}', \sigma)$. Taking for simplicity $R_i(t=0)$ for interconnect i at a constant level $R_0$, $\forall i$, the resistance for each interconnection per unit of time is given by $$R_i(t) = R_0 + t \cdot DR_i(1) \quad \text{(equation 6)}$$

Using equations (2) and (6), the relative resistance change for the total structure is $$\frac{\Delta R_{tot}(t)}{R_{tot}(0)} = \frac{\sum_{i=1}^{N} DR_i(1)}{R_{tot}(0)} \cdot t = \frac{\sum_{i=1}^{N} DR_i(1)}{N \cdot R_0} \cdot t \cong \frac{\mu'}{R_0} \cdot t \quad \text{(equation 7)}$$

where $\mu'$ is the mean of the lognormally distributed $DR_i(1)$ values for the N interconnects. Subsequently, the failure time of the total series structure can be approximated by $$t_F \cong \frac{FC \cdot R_0}{\mu'} \cong \frac{\Delta R'_{med} \cdot MT_F}{\mu'} \quad \text{(equation 8)}$$

For parallel structures, where the current density $j_i$ is not constant, the situation is far more complicated. The resistance $R_i$ and the current density $j_i$ of the $i^{th}$ interconnection after 1 time unit $t_1$, respectively, are given by $$R_i(t_1) = R_0 \frac{FC}{t_f} t_1 + R_0 \quad \text{(equation 9)}$$

$$j_i(t_1) = \frac{j_{tot}}{R_i(t_1)} R_{tot}(t_1) \quad \text{(equation 10)}$$

$$j_{tot} = N \cdot j_0 \quad \text{(equation 11)}$$

where i=1, ..., N and $j_0$ denotes the mean current density through every interconnect at time 0, $j_{tot}$ the constant current density of the structure and $R_i(t_1)$ the resistance of the parallel structure at time $t_1$. At time $t_2=2t_1$, it is assumed that the current density does not change during this step, so $$R_i(t_2) = R_i(t_1) + (R_i(t_1) - R_0)\left[\frac{j_i(t_1)}{j_0}\right]^n \quad \text{(equation 12)}$$

In contrast to a series structure it is not easy to derive an equation for the failure time for the total structure. Only by simulation experiments it is possible to study the behaviour of the currents and relative resistance changes of the individual interconnects.

The results of the simulation are analysed. The four estimated parameters are $MT_F$ and $\sigma$ for $t_f \propto \log n$ ($MT_F$,$\sigma$), the activation energy $E_a$ and the current density exponent n, respectively. Note that one is primarily interested in $E_a$ and n. For obtaining those values also the $MT_F$ need be determined. For the simulation experiments N interconnects in a series and/or parallel structure are taken with length L=2000 μm, thickness d=0.5 μm, width b=0.5 μm, resistivity $\rho_{Al}$=2.68 μΩcm, current density $j_1$=2MA/cm$^2$, temperature $T_1$=200° C., current density exponent n=2, activation energy $E_a$=0.8 eV, failure times $t_f \propto \log n$ (200, 0.5), failure criterion FC=1 and 500 time steps of 1 hour as standard input values.

A. Relative Resistance Change for Series and Parallel Interconnects

Figure 2:
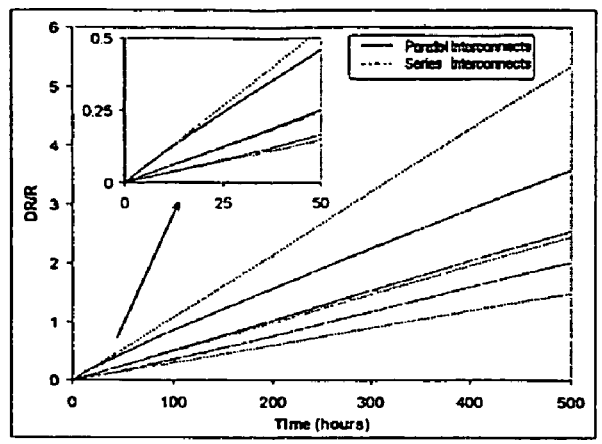
FIG. 2 is a graph of the relative drift for 3 series and parallel interconnects as a function of time for n=2.
Figure 3:
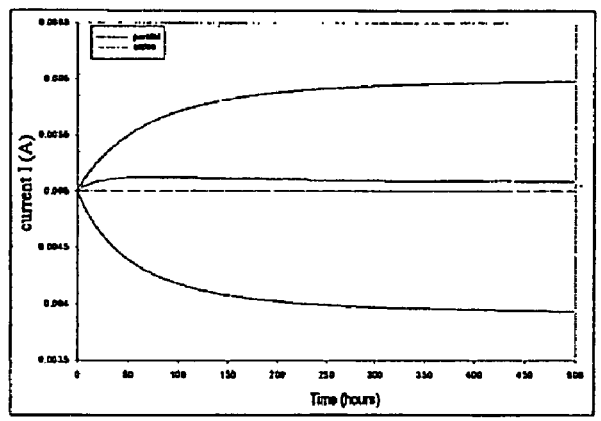
FIG. 3 is a graph of the current through 3 series and 3 parallel interconnects as a function of time.

For the series interconnects the relative resistance drift of the interconnects increases linearly, while for the parallel interconnects the relative resistance drift of the individual interconnects bends towards each other. FIG. 2 shows the relative drift DR/R for 3 series and parallel interconnects as a function of time. The drift velocity of interconnects that start with a relatively high resistance rise, decreases, while the drift velocity of the interconnects that start with a relatively low resistance rise, increases. This is because a lower current will run through the interconnects with the highest rise of resistance, decreasing the accelerating conditions for these interconnects and therefore making these interconnects less sensitive for electromigration at this point in time. The current will then distribute over the other interconnects, making these interconnects more sensitive to EM. In FIG. 3 the current is shown for the interconnects from FIG. 2. Moreover, it appears that as the current density exponent n increases, the drift of the individual interconnects bow more towards each other.

B. Influence of the Current Density Exponent

Table I shows the scale parameters $MT_F$ and shape parameters $\sigma$ estimations for 80 parallel and series interconnects as a function of the current density exponent n, using FC=1.

TABLE I

| | Reliability data analysis | | | | | | | | TR-Analyse | |
| | Series | Parallel | | | | | | Series | parallel |
| | n = 1, 2, 3 | n = 1 | | n = 2 | | n = 3 | | n = 1, 2, 3 | n = 1, 2, 3 |
| sim | $MT_F$ | σ | $MT_F$ | σ | $MT_F$ | σ | $MT_F$ | σ | Tf | tf |
| 1 | 193 | 0.522 | 191 | 0.403 | 191 | 0.317 | 191 | 0.256 | 168 | 196 |
| 2 | 187 | 0.464 | 184 | 0.355 | 184 | 0.279 | 185 | 0.225 | 167 | 188 |
| 3 | 204 | 0.402 | 204 | 0.323 | 204 | 0.254 | 204 | 0.204 | 169 | 207 |

TABLE I-continued

| | Reliability data analysis | | | | | | | | TR-Analyse | |
| | Series | Parallel | | | | | | Series | parallel |
| | $n = 1, 2, 3$ | $n = 1$ | | $n = 2$ | | $n = 3$ | | $n = 1, 2, 3$ | $n = 1, 2, 3$ |
| sim | $MT_F$ | $\sigma$ | $MT_F$ | $\sigma$ | $MT_F$ | $\sigma$ | $MT_F$ | $\sigma$ | Tf | tf |
|---|---|---|---|---|---|---|---|---|---|---|
| 4 | 202 | 0.453 | 200 | 0.358 | 200 | 0.283 | 201 | 0.229 | 180 | 205 |
| 5 | 209 | 0.476 | 207 | 0.373 | 207 | 0.293 | 208 | 0.236 | 187 | 212 |
| 6 | 196 | 0.504 | 194 | 0.393 | 192 | 0.262 | 195 | 0.252 | 172 | 199 |
| 7 | 203 | 0.437 | 202 | 0.339 | 203 | 0.274 | 203 | 0.222 | 185 | 207 |
| 8 | 220 | 0.457 | 218 | 0.358 | 218 | 0.282 | 220 | 0.227 | 197 | 223 |
| 9 | 200 | 0.505 | 198 | 0.394 | 198 | 0.31 | 199 | 0.25 | 176 | 203 |
| 10 | 202 | 0.44 | 202 | 0.35 | 202 | 0.275 | 202 | 0.222 | 184 | 206 |
| 11 | 214 | 0.472 | 213 | 0.366 | 213 | 0.286 | 213 | 0.23 | 193 | 217 |
| 12 | 209 | 0.481 | 209 | 0.38 | 209 | 0.3 | 209 | 0.242 | 187 | 214 |
| 13 | 196 | 0.491 | 195 | 0.384 | 195 | 0.302 | 195 | 0.244 | 174 | 199 |
| 14 | 193 | 0.484 | 190 | 0.368 | 190 | 0.289 | 191 | 0.233 | 171 | 194 |
| 15 | 186 | 0.469 | 185 | 0.367 | 185 | 0.295 | 186 | 0.237 | 167 | 189 |
| 16 | 194 | 0.454 | 191 | 0.347 | 191 | 0.273 | 192 | 0.22 | 174 | 195 |
| 17 | 182 | 0.511 | 181 | 0.409 | 181 | 0.322 | 182 | 0.26 | 159 | 186 |
| 18 | 203 | 0.399 | 201 | 0.302 | 201 | 0.237 | 202 | 0.191 | 188 | 204 |
| 19 | 204 | 0.466 | 202 | 0.364 | 202 | 0.286 | 203 | 0.231 | 183 | 207 |
| 20 | 188 | 0.453 | 185 | 0.344 | 185 | 0.27 | 186 | 0.217 | 169 | 189 |
| mean | 199 | 0.47 | 198 | 0.364 | 198 | 0.284 | 198 | 0.231 | 179 | 202 |
| error | 9 | 0.032 | 7 | 0.026 | 6 | 0.021 | 5 | 0.016 | 10 | 10 |

It is to be noted that µ for both series and parallel interconnects agree with the proposed median failure time of 200 hours of the individual interconnects used as an input parameter for the simulated data. Table I shows that for every current density exponent n, the failure time of the total parallel structure (with FC=1) agrees with said value of 200 hours for the scale parameter $MT_F$. This means that a parallel EM test structure is a correct approach for the determination of the failure time of submicron interconnects. For the total series structure, the failure time of the total structure deviates from the proposed value for $MT_F$ of the individual interconnects. This can easily be explained by the asymmetry of the distributed failure times and using equations (7) and (8).

For series interconnects the shape parameter obtained with the reliability data analysis is in agreement with the expected value of 0.5, while for parallel interconnects the shape parameter is smaller. This is due to the fact that for the parallel interconnects, the relative resistance drifts of the individual interconnects bow towards each other, as mentioned before. For increasing n, the drifts of the parallel interconnects bend even more towards each other, thereby decreasing the shape parameter. Therefore further investigations on the dependence of the shape parameter σ on several input parameters are required.

Figure 4:
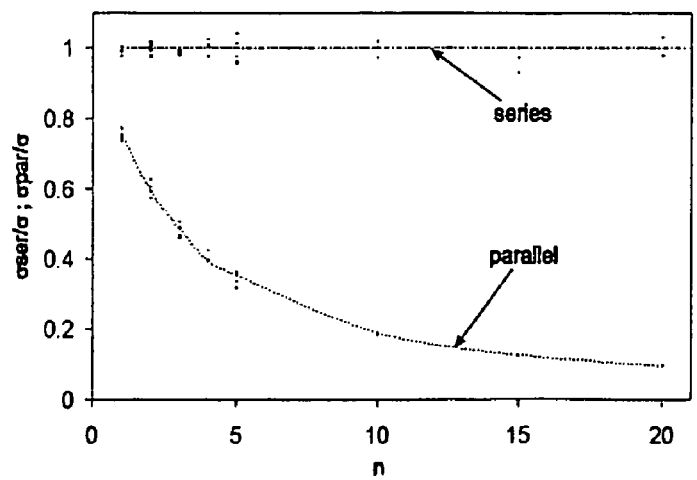
FIG. 4 is a graph of $\sigma_{par}/\sigma$ and $\sigma_{ser}/\sigma$ as a function of n for several input values of $\sigma$ (0.1 till 1.0) and with a fixed FC=1, where $\sigma_{par}$ and $\sigma_{ser}$ are respectively the shape parameter for the parallel and series interconnects gained from the simulation experiments. σ is the input parameter for the simulation experiments.

The shape parameter obtained from the simulation experiments with reliability data analysis is denoted $\sigma_{par}$ for the parallel structure and $\sigma_{ser}$ for the serial structure. The shape parameter input value for the simulation experiments is denoted σ. FIG. 4 shows respectively $\sigma_{par}$ and $\sigma_{ser}$ divided by the input value σ for the simulation experiments as a function of n for several values of σ and with a fixed failure criterion FC=1. For the series structure $\sigma_{ser}/\sigma$ is independent of n for several values of σ. For the parallel structure a fixed relationship of $\sigma_{par}/\sigma$ as a function of n can be found for several values of σ. This means that for a fixed FC value, a certain relationship of $\sigma_{par}/\sigma$ as a function of n can be found, independent of the input value σ.

Figure 5:
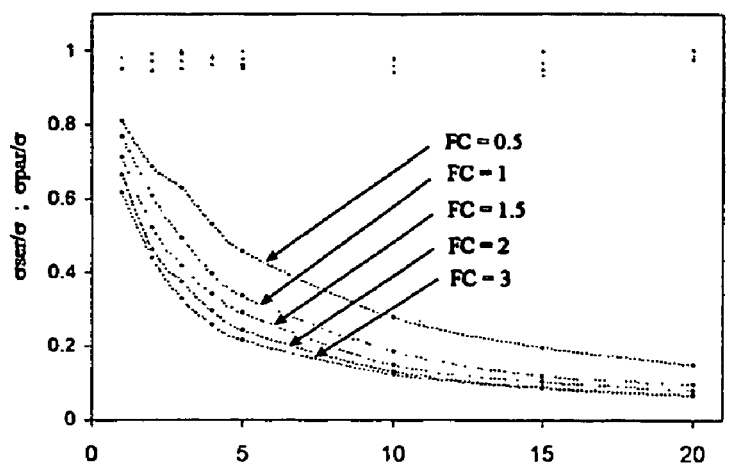
FIG. 5 is a graph of $\sigma_{par}/\sigma$ and $\sigma_{ser}/\sigma$ as a function of n for σ=0.5 and with FC varying from 0.5 to 3.
Figure 6:
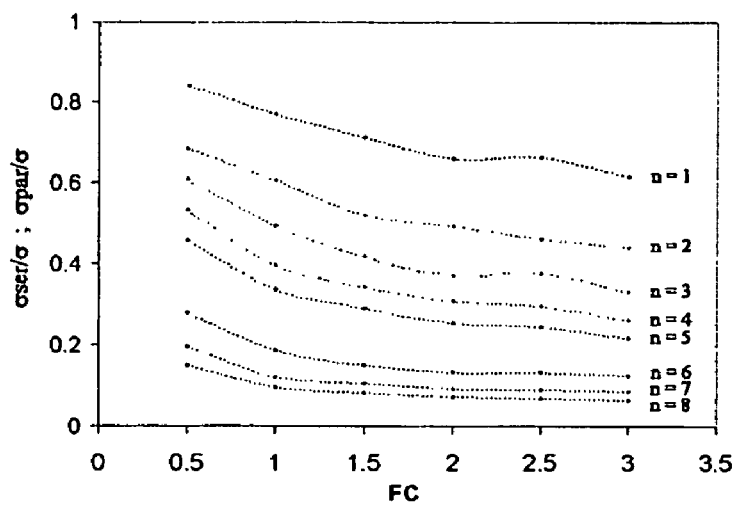
FIG. 6 is a graph of $\sigma_{par}/\sigma$ as a function of FC for σ=0.5 and with n varying from 1 to 20.

To determine the influence of the failure criterion FC on $\sigma_{par}/\sigma$ as a function of n, simulation experiments were carried out with a fixed σ=0.5 and with FC varying from 0.5 to 3. The results are shown in FIG. 5. The results show that the shape of the curves for different FC values doesn't change. For FC>1, the curves move more away from 1, while the opposite is true for FC<1. FIG. 6 shows the relationship between $\sigma_{par}/\sigma$ and FC for different values of n. It is shown that $\sigma_{par}/\sigma$ decreases in the same way, but that for different n, the relationship shifts more towards or more away from 1.

As a consequence of these results, using both FIGS. 5 and 6, and knowing both n and FC, it is possible to estimate the correct shape parameter for parallel test structures. This information extracted from the simulation experiments can be used to correct the shape parameter for real time experiments. However, the method described above may be rather tedious, because every relationship between $\sigma_{par}/\sigma$ and n must be known for all FC values, which is a time-consuming activity. Moreover, the acquired corrected value for $\sigma_{par}$ by applying this method is only a rough estimation of the real value. The method further requires that for each interconnect info on R and I are to be kept. In order to get a more accurate value for the shape parameter, an alternative method is proposed for the correction of the experimental data gained from a parallel structure. More in particular, the alternative method will yield an improved estimate of the shape parameter.

Still a parallel structure of N interconnects is considered. At every moment in time it is known that $$\Delta V(t) = R_j(t) \cdot I_j(t) \quad \text{(equation 13)}$$

where $R_j(t)$ and $I_j(t)$ are the resistance and current value, respectively, of interconnect j at time t. Furthermore, $$I_{tot}(t) = \Delta V(t) \cdot \sum_{j=1}^{N} 1/R_j(t) \quad \text{(equation 14)}$$

Subsequently, $$I_j(t) = \frac{\Delta V(t)}{R_j(t)} = \frac{I_{tot}(t)}{R_j(t) \cdot \left(\sum_{j=1}^{N} \frac{1}{R_j(t)}\right)} \quad \text{(equation 15)}$$

Let $<1/R>_t$ denote the mean of the values $1/R_j(t)$, i.e.

$$\left\langle \frac{1}{R} \right\rangle_t = \frac{1}{N} \cdot \sum_{j=1}^{N} \left(\frac{1}{R_j(t)}\right) \quad \text{(equation 16)}$$

Moreover, if $I_0 = I_{tot}/N$ denotes the mean current per interconnect, equation (15) can be written as $$I_j(t) = \frac{I_0}{R_j(t) \cdot \left\langle \frac{1}{R} \right\rangle_t} \quad \text{(equation 17)}$$

As already mentioned previously, $\Delta R(t)/R_0$ changes linearly as a function of time:

$$\frac{\Delta R(t)}{R_0} \equiv \frac{R(t) - R(t=0)}{R(t=0)} = a \cdot t \quad \text{(equation 18)}$$

where a is a constant.
Subsequently, for every interconnect j, one can write that $$\frac{1}{R_{j0}} \cdot \frac{dR_j(t)}{dt} = a_j = \frac{FC}{(t_F)_j} \quad \text{(equation 19)}$$

Where FC and $(t_F)_j$ are the failure criterion and the failure time of the $j^{th}$ interconnect, respectively. Postulate $a_j = a_j(t)$ as a function of time t, temperature T and current I. In agreement with the Black equation, one can then write $$a_j(t) = a_{j0} \cdot \left[\frac{I_j(t)}{I_0}\right]^n \quad \text{(equation 20)}$$

$a_{j0}$ is the coefficient for interconnect j, with current $I=I_0$ and a certain temperature T.

$$a_{j0} = a_j(I=I_0, T) \quad \text{(equation 21)}$$

Combining equations (19) and (20)

$$\frac{1}{R_{j0}} \cdot \frac{dR_j(t)}{dt} = a_{j0} \cdot \left[\frac{I_j(t)}{I_0}\right]^n \quad \text{(equation 22)}$$

Substitution of equation (17) in equation (22) gives $$\frac{1}{R_{j0}} \cdot \frac{dR_j(t)}{dt} = a_{j0} \cdot \left[\frac{1}{R_j(t) \cdot \left\langle \frac{1}{R} \right\rangle_t}\right]^n \quad \text{(equation 23)}$$

or $$a_{j0} \cdot t = \frac{1}{R_{j0}} \cdot t \cdot \frac{dR_j(t)}{dt} \cdot \left[R_j(t) \cdot \left\langle \frac{1}{R} \right\rangle_t\right]^n \quad \text{(equation 24)}$$

With this equation, it is possible to recalculate the $a_{j0}$ value. In practice, all $R_j(t)$ are known and subsequently also the $<1/R>_t$ values at every t. The only concern is to determine the derivative of the $R_j(t)$ values. In practice, several techniques to determine the derivative of $R_j(t)$ are available. If both $R_j(t)$ and its derivative are known, the right side of equation can be calculated for every t value. If then a straight line is fitted through the corrected points, the slope of this straight line gives the $a_{j0}$ value for interconnect j. Because $a_j = FC/(t_F)_j$, the correct failure times can be determined with the correct $MT_F$ and σ.

The theoretical verification of this method can be achieved by applying it to the data gained from simulation experiments on parallel structures. The simulations are performed in exactly the same conditions as for obtaining the experimental results of Table I. Table II shows the $MT_F$ and σ values, which were estimated from the simulation data of both parallel and corrected structures. Note that the corrected data from the simulation experiments on parallel structures is in good agreement with the expected values for $MT_F$ (=200) and σ (=0.5), used as input parameters for the simulation experiments. This shows this method can correct the data gained from parallel test structures.

TABLE II

| | Parallel | | | | | | Correction | | | | | |
|---|---|---|---|---|---|---|---|---|---|---|---|---|
| | n = 1 | | n = 2 | | n = 3 | | n = 1 | | n = 2 | | n = 3 | |
| sim | $MT_F$ | σ | $MT_F$ | σ | $MT_F$ | σ | $MT_F$ | σ | $MT_F$ | σ | $MT_F$ | σ |
| 1 | 212 | 0.35 | 212 | 0.274 | 213 | 0.221 | 214 | 0.454 | 214 | 0.454 | 214 | 0.454 |
| 2 | 211 | 0.373 | 211 | 0.294 | 212 | 0.237 | 212 | 0.468 | 212 | 0.468 | 212 | 0.468 |
| 3 | 217 | 0.383 | 217 | 0.307 | 218 | 0.244 | 218 | 0.486 | 218 | 0.486 | 218 | 0.486 |
| 4 | 202 | 0.367 | 202 | 0.289 | 203 | 0.233 | 205 | 0.479 | 205 | 0.479 | 205 | 0.479 |
| 5 | 185 | 0.359 | 185 | 0.282 | 186 | 0.227 | 188 | 0.469 | 188 | 0.469 | 188 | 0.469 |
| 6 | 208 | 0.392 | 208 | 0.308 | 209 | 0.248 | 210 | 0.501 | 210 | 0.501 | 210 | 0.501 |
| 7 | 188 | 0.393 | 188 | 0.309 | 188 | 0.249 | 190 | 0.506 | 190 | 0.506 | 190 | 0.506 |
| 8 | 208 | 0.334 | 208 | 0.268 | 209 | 0.216 | 208 | 0.424 | 208 | 0.424 | 208 | 0.424 |
| 9 | 212 | 0.374 | 212 | 0.295 | 213 | 0.238 | 212 | 0.468 | 212 | 0.468 | 212 | 0.468 |
| 10 | 190 | 0.377 | 190 | 0.296 | 191 | 0.239 | 192 | 0.486 | 192 | 0.486 | 192 | 0.486 |
| 11 | 179 | 0.369 | 179 | 0.291 | 180 | 0.235 | 181 | 0.471 | 181 | 0.471 | 181 | 0.471 |

TABLE II-continued

| | Parallel | | | | | | Correction | | | | | |
|---|---|---|---|---|---|---|---|---|---|---|---|---|
| | n = 1 | | n = 2 | | n = 3 | | n = 1 | | n = 2 | | n = 3 | |
| sim | $MT_F$ | σ | $MT_F$ | σ | $MT_F$ | σ | $MT_F$ | σ | $MT_F$ | σ | $MT_F$ | σ |
| 12 | 198 | 0.353 | 198 | 0.283 | 198 | 0.221 | 199 | 0.443 | 199 | 0.443 | 199 | 0.443 |
| 13 | 196 | 0.422 | 196 | 0.334 | 197 | 0.269 | 197 | 0.532 | 197 | 0.532 | 197 | 0.532 |
| 14 | 180 | 0.385 | 180 | 0.286 | 180 | 0.231 | 182 | 0.476 | 182 | 0.476 | 182 | 0.476 |
| 15 | 206 | 0.365 | 206 | 0.287 | 207 | 0.231 | 209 | 0.741 | 209 | 0.741 | 209 | 0.741 |
| 16 | 189 | 0.409 | 189 | 0.321 | 190 | 0.259 | 191 | 0.525 | 191 | 0.525 | 191 | 0.525 |
| 17 | 208 | 0.434 | 208 | 0.344 | 209 | 0.278 | 211 | 0.55 | 211 | 0.55 | 211 | 0.55 |
| 18 | 197 | 0.394 | 197 | 0.310 | 197 | 0.250 | 198 | 0.501 | 198 | 0.501 | 198 | 0.501 |
| 19 | 191 | 0.396 | 191 | 0.314 | 192 | 0.253 | 192 | 0.497 | 192 | 0.497 | 192 | 0.497 |
| 20 | 184 | 0.343 | 184 | 0.269 | 184 | 0.216 | 186 | 0.455 | 186 | 0.455 | 186 | 0.455 |
| mean | 198 | 0.379 | 198 | 0.298 | 199 | 0.240 | 200 | 0.497 | 200 | 0.497 | 200 | 0.497 |
| error | 8 | 0.026 | 6 | 0.022 | 5 | 0.018 | 10 | 0.033 | 10 | 0.033 | 10 | 0.033 |

C. Determination of Activation Energies $E_a$

Consider a system driven by only 1 activation energy ($E_a$=0.8 eV), which in practice is mostly the case. Suppose the failure time $t_F$ of the interconnects at accelerating conditions $j_1$=2MA/cm$^2$ and $T_1$=200° C. is lognormally distributed with $MT_{F1}$=200 and σ=0.5 using FC=1. At higher temperatures 220° C. and 240° C., the scale parameters can be calculated using equation (7). Table III shows the activation energies calculated via the Black equation for both series and parallel test structures, using the TR-analysis and the software package for 80 series and parallel interconnects (n=2).

TABLE III

| | "Failure" analysis | | TR-analysis | |
|---|---|---|---|---|
| Sim | n = 2 series $E_a$ | n = 2 parallel $E_a$ | n = 2 series $E_a$ | n = 2 Parallel $E_a$ |
| 1 | 0.772 | 0.774 | 0.772 | 0.774 |
| 2 | 0.746 | 0.749 | 0.761 | 0.745 |
| 3 | 0.876 | 0.884 | 0.894 | 0.881 |
| 4 | 0.757 | 0.759 | 0.743 | 0.761 |
| 5 | 0.817 | 0.822 | 0.825 | 0.82 |
| 6 | 0.752 | 0.756 | 0.747 | 0.756 |
| 7 | 0.805 | 0.814 | 0.843 | 0.808 |
| 8 | 0.815 | 0.821 | 0.831 | 0.818 |
| 9 | 0.802 | 0.806 | 0.806 | 0.806 |
| 10 | 0.805 | 0.814 | 0.831 | 0.810 |
| 11 | 0.809 | 0.812 | 0.804 | 0.813 |
| 12 | 0.858 | 0.866 | 0.875 | 0.863 |
| 13 | 0.854 | 0.86 | 0.879 | 0.855 |
| 14 | 0.792 | 0.792 | 0.791 | 0.791 |
| 15 | 0.759 | 0.765 | 0.767 | 0.764 |
| 16 | 0.778 | 0.783 | 0.809 | 0.776 |
| 17 | 0.718 | 0.725 | 0.724 | 0.724 |
| 18 | 0.801 | 0.804 | 0.827 | 0.799 |
| 19 | 0.793 | 0.796 | 0.790 | 0.796 |
| 20 | 0.778 | 0.781 | 0.803 | 0.776 |
| mean | 0.79 | 0.80 | 0.81 | 0.80 |
| error | 0.02 | 0.02 | 0.1 | 0.1 |

Figure 7:
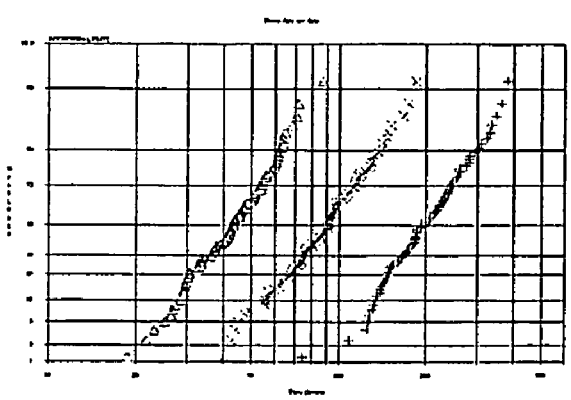
FIG. 7 is a graph of the cumulative failure plot of the failure times of the parallel interconnects from simulation 9 in table III.

For both methods the mean values of the activation energies agree very well the proposed value of 0.8 eV that was an input parameter for the simulated data. This implies that for the monomodal lognormally distributed failure times, both series and parallel test structures can be used for the determination of both the activation energy and the current density exponent n. Also n is computed via the Black equation. FIG. 7 shows the cumulative failure plot of the failure times for the 80 parallel interconnects of simulation experiment 9 in tables I and III.

As already mentioned before, the current density and the temperature of the sample have to remain constant during the entire test in order to guarantee an accurate time to failure determination. To keep the temperature of the sample constant during the entire test, the joule heating of the interconnect has to be taken into account, Joule heating is created when a current is applied to the interconnect. The interconnect temperature is given by the following equation:

$$T_i = T_o + P_{Ei}\theta_i \text{ with } P_{Ei} = I_{DC}^2 R_i \qquad \text{(equation 25)}$$

where $T_i$ is the actual temperature of the interconnect, $T_o$ the oven temperature, $P_{Ei}$ the power dissipated by the interconnect, $\theta_i$ the thermal resistance and $R_i$ the electrical resistance of each interconnect.

In conventional median time to failure ($MT_F$) tests the joule heating of the interconnect is estimated and the oven temperature is decreased with the estimated value of the joule heating in the beginning of the test, but this is not sufficient. During the electromigration (EM) test the resistance of the interconnect increases and so the joule heating also increases. From equation 25 it can be concluded that the interconnect temperature will increase, thus giving rise to the acceleration of the EM process.

This problem can be solved by using an AC current based dynamic joule correction, by which no EM damage occurs. During the determination of the thermal resistance of the interconnect the same temperature and the same RMS value of the current is used as in the proper EM test. This approach is described with more details in the following paragraphs.

Figure 8:
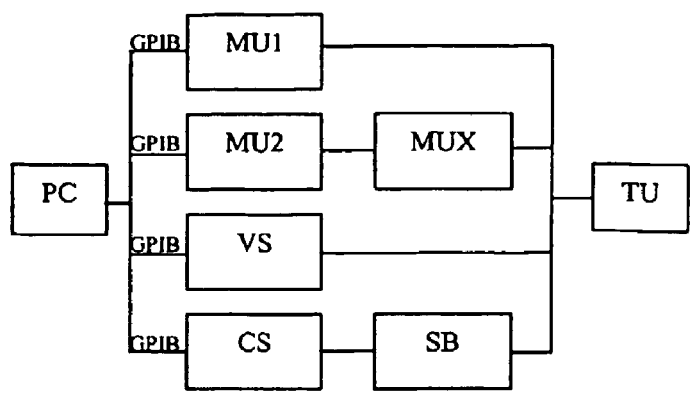
FIG. 8 represents a block diagram of a Median Time to Failure test system.
Figure 9:
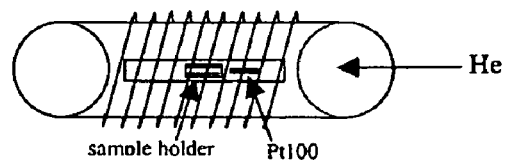
FIG. 9 represents a scheme of a gastube oven.

A block diagram of the mean time to failure test system is shown in FIG. 8. It consists of a PC, two measuring units (MU), a multiplexer (MUX), a programmable voltage source (VS), a switch box (SB), a programmable current source (CS) and a thermal unit (TU). A GPIB-bus interconnects the PC, the MU's, the VS and the CS. The thermal unit consists of a gastube oven with a sample holder and a Pt100-temperature sensor connected flow upwards of the sample holder (FIG. 9). A gastube oven is especially used because of several features. In a gastube oven different atmospheres can be created. An atmosphere of helium can be used for example. From the different measurements a place is determined where the Pt100-temperature sensor picks up only 1% of the joule heating of the sample and where the temperature relationship $T_o(T_s)$ is stable, $T_o$ being the oven temperature and $T_s$ the sample temperature measured by the Pt100-temperature sensor.

Figure 10A:
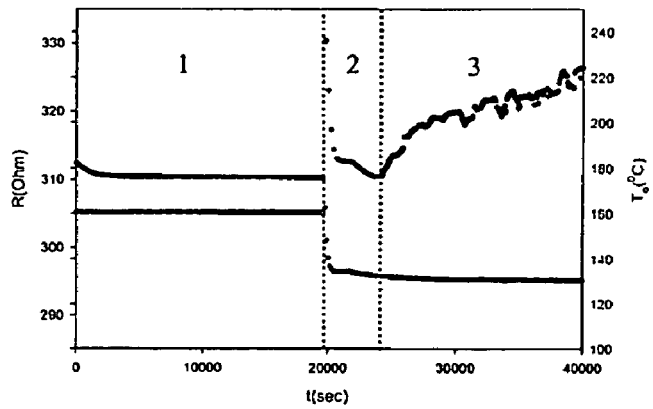
FIG. 10 is a graph of the evolution of the interconnect resistance and the oven temperature ($T_i$=180° C., I=25 mA) (FIG. 10*a*) and a current profile of the test (FIG. 10*b*).
Figure 10B:
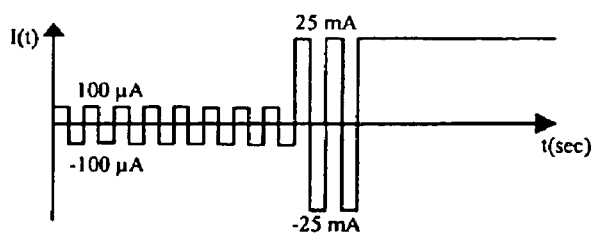
Figure 11A:
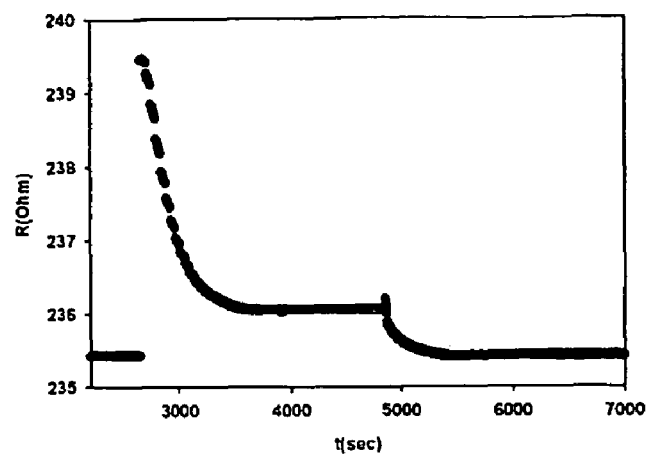
FIG. 11*a* is a graph of the evolution of the resistance and FIG. 11*b* the temperature versus time during a test ($I_{AC}$=10 mA, $T_s$=100° C.).
Figure 11B:
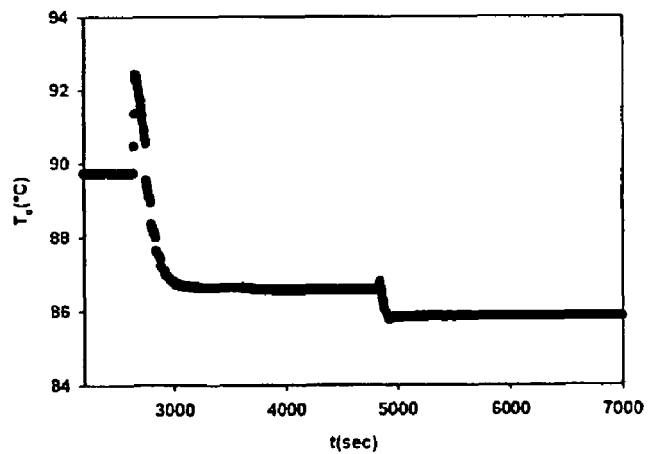

For the EM test the test system sequentially performs the following steps: annealing of the sample and determination of the temperature coefficient of resistance (TCR), estimation of the thermal resistance and the EM test with dynamic joule correction. During the first step (FIG. 10) annealing takes place, in which a small AC current is supplied to the sample, until all defects are annealed. During the second step the thermal resistance of the interconnect is determined at exactly the same sample temperature as during the actual EM test by supplying an AC current with the same RMS value as the DC-current of the EM test. By using this AC current, the same joule heating is created as during the EM test, but no EM damage occurs. When the high AC current is applied, the resistance of the interconnect rises rapidly due to the joule heating, as can be seen in FIG. 10. The oven temperature is then lowered based on equation 25. A starting value has to be used for the thermal resistance, and a few iterations have to be performed to find the optimum thermal resistance value. The iteration is complete when the resistance value at the end of phase 2 equals the value at the end of phase 1 (FIG. 11). During the last step the EM test is performed with a constant sample temperature by making use of equation 25 and the value of the thermal resistance as determined in phase 2.

This approach has several advantages: no temperature change occurs at the start of the EM experiment, the thermal resistance is determined at the actual test temperature and the TCR determination is not needed for the determination of the thermal resistance. Further the current density exponent n and the activation energy $E_a$ can be determined with high accuracy. This will be detailed subsequently.

Figure 12:
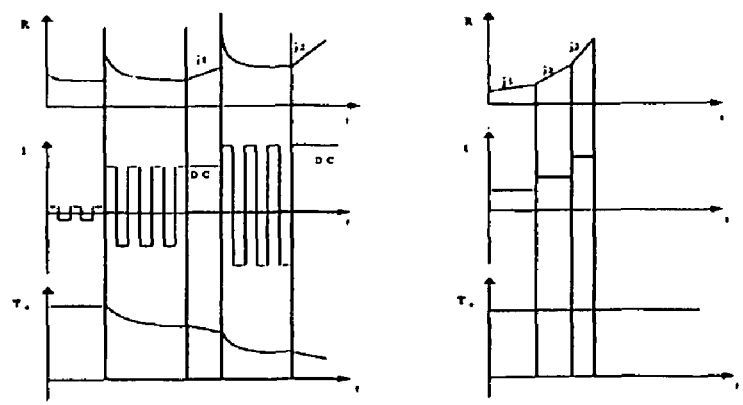
FIG. 12 is a graph of the current profile, resistance and oven temperature change versus time of the MTF test system (left) and the conventional system (right) for determining the current density exponent n.

As already discussed previously, conventional methods make use of the cross-cut technique to determine the acceleration parameters. Due to the inherent statistical scattering of the degradation curves, a lot of samples are needed to get rid of the statistical effects. These statistical effects can be excluded by using only one sample to complete the determination of the acceleration parameters $E_a$ and n. To determine the current density exponent the interconnect resistance is measured during several current density values. It is very important that here also the sample temperature remains the same, therefore the AC-current is used to determine the thermal resistance of the interconnect at a certain current density. When the thermal resistance is known, the EM test is performed until the current density is raised again (FIG. 12).

A clear benefit of this approach is that no temperature change occurs at the start of the EM experiment. This is particularly important due to the fact that the current density exponent is determined by the ratio of the resistance change slope at the start of the EM experiment and at the end of the previous EM experiment performed at a lower current. This ratio is important for defining the velocity of resistance change ($v_R$).

$$v_R = \frac{d(\Delta R/R)}{dt} \text{ (in } ppm/s\text{)} \quad \text{(equation 26)}$$

The parameter $v_R$ is inversely proportional to the time to failure:

$$v_R = A' \cdot j^n \cdot e^{-E/kT} \text{ with A' a constant} \quad \text{(equation 27)}$$

The current density exponent n can then easily be determined.

Whereas conventional systems keep the current density constant and raise the oven temperature in certain steps in order to estimate the activation energy, an approach according to the present disclosure proposes to measure the resistance versus time while the sample temperature is raised in certain steps and the current density value is kept constant. An AC current is used to determine the thermal resistance every time the sample temperature is raised. When the thermal resistance is known the EM test is started by applying a DC current until the sample temperature is raised again. During this EM test the oven temperature is adjusted in order to keep the sample temperature at the desired value.

A clear advantage of this measuring method is that the sample temperature is stable when the EM experiment is started. This is important because the activation energy is determined from the ratio of the resistance change slope at the start of the EM experiment and at the end of the previous EM experiment performed at a lower temperature.

The invention claimed is:

1. A method for determining time to failure characteristics of an on-chip interconnect subject to electromigration, comprising the steps of:
   providing a test structure comprising a parallel connection of a plurality of such on-chip interconnects; and
   performing at least two electromigration tests on the test structure, wherein each test comprises:
   applying a particular current density and a particular sample temperature to the test structure and measuring a first electrical resistance,
   applying a first alternating current with a first root mean square (RMS) value to anneal the test structure,
   applying a second alternating current with a second RMS value greater than the first RMS value and measuring a second electrical resistance greater than the first resistance,
   adjusting an oven temperature to a particular oven temperature and measuring a third electrical resistance that is substantially equal to the first electrical resistance,
   based on the particular oven temperature, determining a thermal resistance of the test structure for the particular current density and the particular sample temperature, and
   applying a direct current with a third RMS value substantially equal to the second RMS value and determining a plurality of electrical resistance measurements of the on-chip interconnects while approximately maintaining the particular stress temperature using the thermal resistance; and
   based on the resistance measurements of each test, determining at least one time to failure characteristic of the test structure.

2. The method of claim 1, wherein the at least one time to failure characteristic comprises a median lifetime of the on-chip interconnects.

3. The method of claim 2, wherein the median lifetime ($MT_F$) for a particular current density (j) in $MA/cm^2$ and a particular sample temperature (T) in K using the Black model, is given by $$MT_F = Aj^{-n}\exp\left(\frac{E_a}{k_B T}\right),$$

where A is a material constant, $k_B$ is the Boltzmann constant, n is a current density exponent, and $E_a$ is an activation energy, the method further comprising:
   based on the resistance measurements, estimating n and $E_a$.

4. The method of claim 3, wherein determining the at least one time to failure characteristic of the test structure comprises determining the at least one time to failure characteristic under real life conditions by extrapolation using the Black model.

5. The method of claim 2, wherein the at least one time to failure characteristic further comprises a shape parameter of a time to failure probability distribution.

6. The method of claim 5, further comprising correcting the shape parameter by fitting based on a predetermined relationship.

7. The method of claim 1, wherein the parallel connection of the on-chip interconnects is within a single package.

8. The method of claim 1, wherein:
the at least two electromigration tests comprise at least three electromigration tests, and
the particular temperatures of each test comprise at least three different temperatures.

9. The method of claim 1, wherein the on-chip interconnect is in a 90 nm technology.

10. The method of claim 1, wherein the on-chip interconnect is in a sub-90 nm technology.

11. A computer program product stored in a non-transitory computer readable medium containing instructions, which, when executed, perform the method of:
performing at least two electromigration tests on a test structure comprising a parallel connection of a plurality of on-chip interconnects subject to electromigration, wherein each test comprises:
applying a particular current density and a particular sample temperature to the test structure and measuring a first electrical resistance,
applying a first alternating current with a first root mean square (RMS) value to anneal the test structure,
applying a second alternating current with a second RMS value greater than the first RMS value and measuring a second electrical resistance greater than the first resistance,
adjusting an oven temperature to a particular oven temperature and measuring a third electrical resistance that is substantially equal to the first electrical resistance,
based on the particular oven temperature, determining a thermal resistance of the test structure for the particular current density and the particular sample temperature, and
applying a direct current with a third RMS value substantially equal to the second RMS value and determining a plurality of electrical resistance measurements of the on-chip interconnects while approximately maintaining the particular stress temperature using the thermal resistance; and
based on the resistance measurements of each test, determining at least one time to failure characteristic of the test structure.

* * * * *